United States Patent
Buh et al.

(10) Patent No.: US 7,176,049 B2
(45) Date of Patent: Feb. 13, 2007

(54) METHOD OF INCREASING A FREE CARRIER CONCENTRATION IN A SEMICONDUCTOR SUBSTRATE

(75) Inventors: Gyoung Ho Buh, Suwon-si (KR); Ji-Sang Yahng, Seoul-si (KR); Yu Gyun Shin, SungNam-si (KR); Guk-Hyon Yon, Suwon-si (KR); Sangjin Hyun, Kwachon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 255 days.

(21) Appl. No.: 10/845,589

(22) Filed: May 14, 2004

(65) Prior Publication Data

US 2005/0062175 A1   Mar. 24, 2005

(30) Foreign Application Priority Data

Sep. 22, 2003   (KR) ............ 10-2003-0065686

(51) Int. Cl.
*H01L 21/00* (2006.01)
(52) U.S. Cl. ................ 438/57; 438/535; 257/E21.133; 257/E21.347
(58) Field of Classification Search ............. 438/57, 438/22, 25, 26, 29, 9, 45, 64, 502, 509, 513, 438/514, 522, 535
See application file for complete search history.

(56) References Cited

U.S. PATENT DOCUMENTS

| | | | |
|---|---|---|---|
| 4,155,779 A | * | 5/1979 | Auston et al. ......... 148/1.5 |
| 4,234,356 A | | 11/1980 | Auston et al. |
| 5,319,655 A | * | 6/1994 | Thornton ............... 372/23 |
| 6,027,989 A | * | 2/2000 | Poole et al. ........... 438/522 |
| 6,514,784 B1 | | 2/2003 | Dubowski |

OTHER PUBLICATIONS

Aubin, et al., Proc. of SPIE vol. 5116, pp. 531-535 (2003) Entitled: "Laser Annealing for high-Q MEMS Resonators".
Liu, et al., J. Appl. Phys. 62(3):1006-1009, (Aug. 1, 1987) Entitled: Theoretical approach to the optimal preheating temperature for cw $CO_2$ laser annealing of semiconductors.
Celler, et al., J. Appl. Phys. 50(11):7264-7266 (Nov. 1979) Entitled: "cw infrared laser annealing of ion-implanted silicon".
Kim, et al., IEEE Transactions on Electron Devices, 49(10):1748-1754 (Oct. 2002) Entitled: "Advanced source/drain engineering for box-shaped ultrashallow junction formation using laser annealing and pre-amorphization implantation in sub-100-nm SOI CMOS".

(Continued)

*Primary Examiner*—David Nhu
(74) *Attorney, Agent, or Firm*—Lee & Morse, P.C.

(57) ABSTRACT

A method of selectively heating a predetermined region of a semiconductor substrate includes providing a semiconductor substrate, selectively focusing a free carrier generation light on only a predetermined region of the semiconductor substrate, irradiating the free carrier generation light on the predetermined region of the semiconductor substrate to increase a free carrier concentration within the predetermined region of the semiconductor substrate, wherein the free carrier generation light causes the predetermined region to increase in temperature by less than a temperature necessary to change the solid phase of the predetermined region, and irradiating the semiconductor substrate with a heating light to selectively heat the predetermined region of the semiconductor substrate.

28 Claims, 11 Drawing Sheets

OTHER PUBLICATIONS

Park, K.C., et al., IEDM 22.5.1 pp. 573-576, IEEE (2000) Entitled: Junction defects of self-aligned, excimer-laser-annealed poly-Si TFTs.

Zheng, M., et al., Applied Physics Letters, 79(16):2606-2608 (Oct. 15, 2001) Entitled: Magnetic nanodot arrays produced by direct laser interference lithography.

Shtyrkov, et al., Sov. Phys. Semicond., 9(10):1309-1310, (1976) Entitled: Local laser annealing of implantation doped semiconductor layers.

Sze, S.M., Physics of Semiconductor Devices, (Physics and Properties of Semiconductors—A Resume—Carrier Concentration at Thermal Equilibrium) pp. 16-20 & 748-751.

Falk, R. Aaron, OptoMetrix, Inc., Renton, Washington, pp. 1-7 Entitled: Near IR absorption I heavily doped silicon—an empirical approach.

Optical Properties of Silicon—Si—Silicon—Optical properties (3 pages) Webpage http://www.ioffe.rssi.ru/SVA/NSM/Semicond/Si/optic.html.

* cited by examiner

METHOD OF INCREASING A FREE CARRIER CONCENTRATION IN A SEMICONDUCTOR SUBSTRATE

BACKGROUND OF THE INVENTION

1. Field of the Invention

The present invention relates to a method of increasing a free carrier concentration in a semiconductor substrate. More particularly, the present invention relates to a method of heating a semiconductor substrate using a laser that is absorbed in the semiconductor substrate due to an increased free carrier concentration in the semiconductor substrate.

2. Description of the Related Art

As ULSI devices are scaled down below 100 nm, a highly-doped ultra shallow junction is required for high performance devices with a short channel. In order to achieve a shallow junction, rapid annealing (i.e., on the order of milliseconds) technology is required. A laser annealing method has been proposed as an ideal technique for this purpose, however, it is well known that there are detrimental effects associated with laser annealing, such as a pattern effect or a diffraction effect, that prevent it from being adopting in an ultra large scale integration (ULSI) process. A pattern effect, for example, is caused when a laser used in the annealing process has a wavelength that is similar to a device size. The pattern effect results in adjacent regions being heating differently.

One way to overcome the pattern effect is to use a laser having a wavelength that is significantly longer, i.e., larger, than a device size, for example, an infrared laser. An example of an infrared laser is a $CO_2$ laser, which is relatively common, is relatively inexpensive, has a high power, and has a relatively long wavelength of 10 µm. More specifically, a $CO_2$ laser has a maximum power of about 3000 W. By comparison, most lasers typically have a power of less than 10 W.

Conventionally, $CO_2$ lasers have not been suitable for use in semiconductor processing because, for example, a $CO_2$ laser having a wavelength of 10 µm is not absorbed by a semiconductor substrate. In fact, the $CO_2$ laser simply passes through the substrate without being absorbed. More specifically, as may be seen in FIG. 1, an absorption coefficient of silicon, for example, is virtually zero (0) at wavelengths of 1.1 µm and above. FIG. 1 is a graph of absorption coefficient versus wavelength for an undoped silicon wafer.

FIG. 2 is a graph of absorption coefficient ($\alpha$) versus wavelength ($\lambda$) at varying doping levels of a p-type silicon (Si) wafer at a temperature of 300 K. FIG. 2 additionally is a graph showing a relationship between free carrier concentration and absorption coefficient.

In FIG. 2, a first hole concentration (line 1) is $4.6 \times 10^{17}$ $cm^{-3}$, a second hole concentration (line 2) is $1.4 \times 10^{18}$ $cm^{-3}$, a third hole concentration (line 3) is $2.5 \times 10^{18}$ $cm^{-3}$, and a fourth hole concentration (line 4) is $1.68 \times 10^{19}$ $cm^{-3}$. As may be seen in FIG. 2, with a free carrier concentration of approximately $10^{18}$ $cm^{-3}$, an absorption coefficient at a wavelength of 10 µm is about 300 $cm^{-1}$. At an absorption coefficient of about 300 $cm^{-1}$, a silicon substrate can be sufficiently heated by a laser having a wavelength of 10 µm. Thus, a silicon substrate can be effectively heated by a laser having a relatively long wavelength if the concentration of the free carrier is sufficiently increased in the silicon substrate.

Referring back to FIG. 1, it may also be noted that a thickness of a light absorbing layer xj decreases as an absorption coefficient increases. Accordingly, an annealing depth may be controlled by adjusting a wavelength of the incident light.

The present invention relates to a laser annealing method using an infrared laser, which causes only negligible defects, such as a pattern effect and a diffraction effect. In general, infrared laser beams are not absorbed by undoped Si wafers. The present invention increases an absorption coefficient of a semiconductor substrate by increasing a free carrier concentration in the semiconductor substrate, thereby making heating with an infrared laser possible. Moreover, the present invention provides a localized heating method to heat a selected region of a semiconductor wafer in the micro scale, which has been impossible with conventional heating technology.

The embodiments of the present invention are able to increase free carrier concentration to a level of $10^{18}$ $cm^{-3}$ in order to increase an absorption coefficient to a sufficient range of approximately $10^3$ $cm^{-1}$, thereby allowing use of a 10 µm wavelength $CO_2$ laser to heat the semiconductor substrate.

SUMMARY OF THE INVENTION

In an effort to overcome at least some of the problems described above, the present invention provides a method of increasing a free carrier concentration of a semiconductor substrate in order to increase an absorption coefficient of the semiconductor substrate, thereby allowing heating a semiconductor substrate using a laser having a relatively long wavelength.

It is a feature of an embodiment of the present invention to provide a method of selectively heating a predetermined region of a semiconductor substrate including providing a semiconductor substrate, selectively focusing a free carrier generation light on only a predetermined region of the semiconductor substrate, irradiating the free carrier generation light on the predetermined region of the semiconductor substrate to increase a free carrier concentration within the predetermined region of the semiconductor substrate, wherein the free carrier generation light causes the predetermined region to increase in temperature by less than a temperature necessary to change the solid phase of the predetermined region, and irradiating the semiconductor substrate with a heating light to selectively heat the predetermined region of the semiconductor substrate.

In the method, a one-photon energy of the free carrier generation light may have an energy greater than a band gap energy of the semiconductor substrate.

Preferably, the free carrier generation light causes the predetermined region to increase in temperature by approximately 5° C. or less. Preferably, the free carrier generation light is a laser beam having a wavelength of approximately 670 nm, a diameter of approximately 50 µm, and a power of approximately 100 mW. The free carrier generation light may be a W-Halogen lamp.

In the method, selectively focusing the free carrier generation light may include either aligning a mask above the semiconductor substrate or aligning a condensing lens above the semiconductor substrate.

The semiconductor substrate is preferably formed of a material selected from the group consisting of Si, Ge, GaAs, and InAs.

The heating light may have a wavelength greater than a wavelength corresponding to a band gap energy of the semiconductor substrate. Preferably, the heating light has a power sufficiently high to heat selectively only the predetermined region of the semiconductor substrate. A wavelength of the heating light may be sufficiently large to selectively heat the predetermined region of the semiconductor substrate by a free carrier absorption mechanism.

The heating light may be an infrared laser, such as a $CO_2$ laser. The heating light may have a power of up to approximately 3000 W.

In the method, the heating light may be irradiated onto either a front surface or a rear surface of the semiconductor substrate.

In the method, irradiating the semiconductor substrate with a heating light to selectively heat the predetermined region of the semiconductor substrate may be performed in an oxygen environment, wherein a reaction occurs only at the predetermined region of the semiconductor substrate.

The method may further include forming a first oxide layer on the semiconductor substrate before irradiating the free carrier generation light, wherein irradiating the semiconductor substrate with a heating light to selectively heat the predetermined region of the semiconductor substrate causes a second oxide layer to be formed on the first oxide layer only in the predetermined region.

In the method, the predetermined region of the semiconductor substrate may be a first high concentration free carrier region in a trench isolation structure, the first high concentration free carrier region preferably being located above an active area between adjacent trench isolation regions in the semiconductor substrate.

The method may further include forming a dielectric layer and an active layer sequentially on the semiconductor substrate before irradiating the free carrier generation light, the active layer including regions of amorphous or polycrystalline silicon and device isolation regions, wherein irradiating the semiconductor substrate with a heating light to selectively heat the predetermined region of the semiconductor substrate selectively converts the regions of amorphous or polycrystalline silicon into crystallized active areas. In this case, the semiconductor substrate may be a silicon (Si) wafer or a glass surface.

It is another feature of an embodiment of the present invention to provide a method of heating a semiconductor substrate including providing a semiconductor substrate, heating the semiconductor substrate to thermally generate free carriers, thereby increasing a free carrier concentration of the semiconductor substrate and increasing an absorption coefficient of the semiconductor substrate, and irradiating the semiconductor substrate with a heating light to heat the semiconductor substrate. In this case, either the semiconductor substrate may be formed of silicon (Si) and may be heated to a temperature of about 800° C. or the semiconductor substrate may be formed of germanium (Ge) and may be heated to a temperature of about 500° C.

Preferably, the heating light is an infrared laser, such as a $CO_2$ laser, and has a power of up to 3000 W.

It is still another feature of an embodiment of the present invention to provide a method of selectively heating a predetermined region of a semiconductor substrate including providing a semiconductor substrate, aligning a mask above the semiconductor substrate to expose the predetermined region of the semiconductor substrate, performing a doping process on the exposed predetermined region of the semiconductor substrate, and irradiating the semiconductor substrate with a heating light to selectively heat the predetermined region of the semiconductor substrate.

In this case, the doping process may sufficiently increase an absorption coefficient of the predetermined region to provide absorption of the heating light. Alternately, the method may further include activating a dopant used in the doping process by heating the semiconductor substrate, thereby increasing an absorption coefficient of the predetermined region. Activating the dopant used in the doping process may include heating the semiconductor substrate to a temperature of approximately 500° C. to 700° C. In this method, the doping process is selected from the group consisting of ion implantation, diffusion, and in-situ doping.

In this method, irradiating the semiconductor substrate with a heating light to selectively heat the predetermined region of the semiconductor substrate may be performed in an oxygen environment to grow an oxide layer only on the predetermined region of the semiconductor substrate.

Preferably, the heating light is an infrared laser, such as a $CO_2$ laser, and has a power of up to 3000 W.

BRIEF DESCRIPTION OF THE DRAWINGS

The above and other features and advantages of the present invention will become more apparent to those of ordinary skill in the art by describing in detail preferred embodiments thereof with reference to the attached drawings in which.

DETAILED DESCRIPTION OF THE INVENTION

Figure 1:
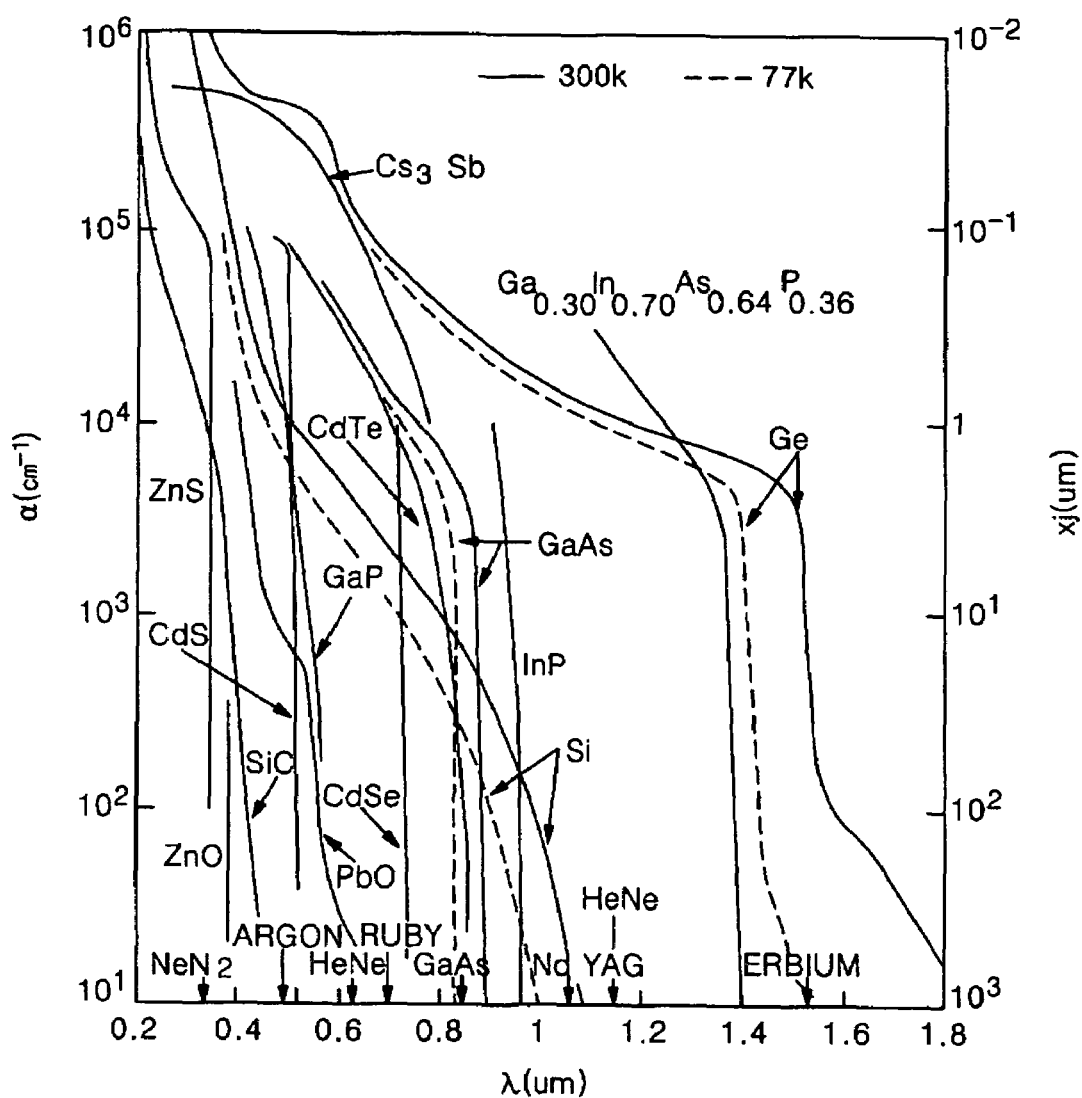
FIG. 1 is a graph of absorption coefficient versus wavelength for an undoped silicon wafer.
Figure 2:
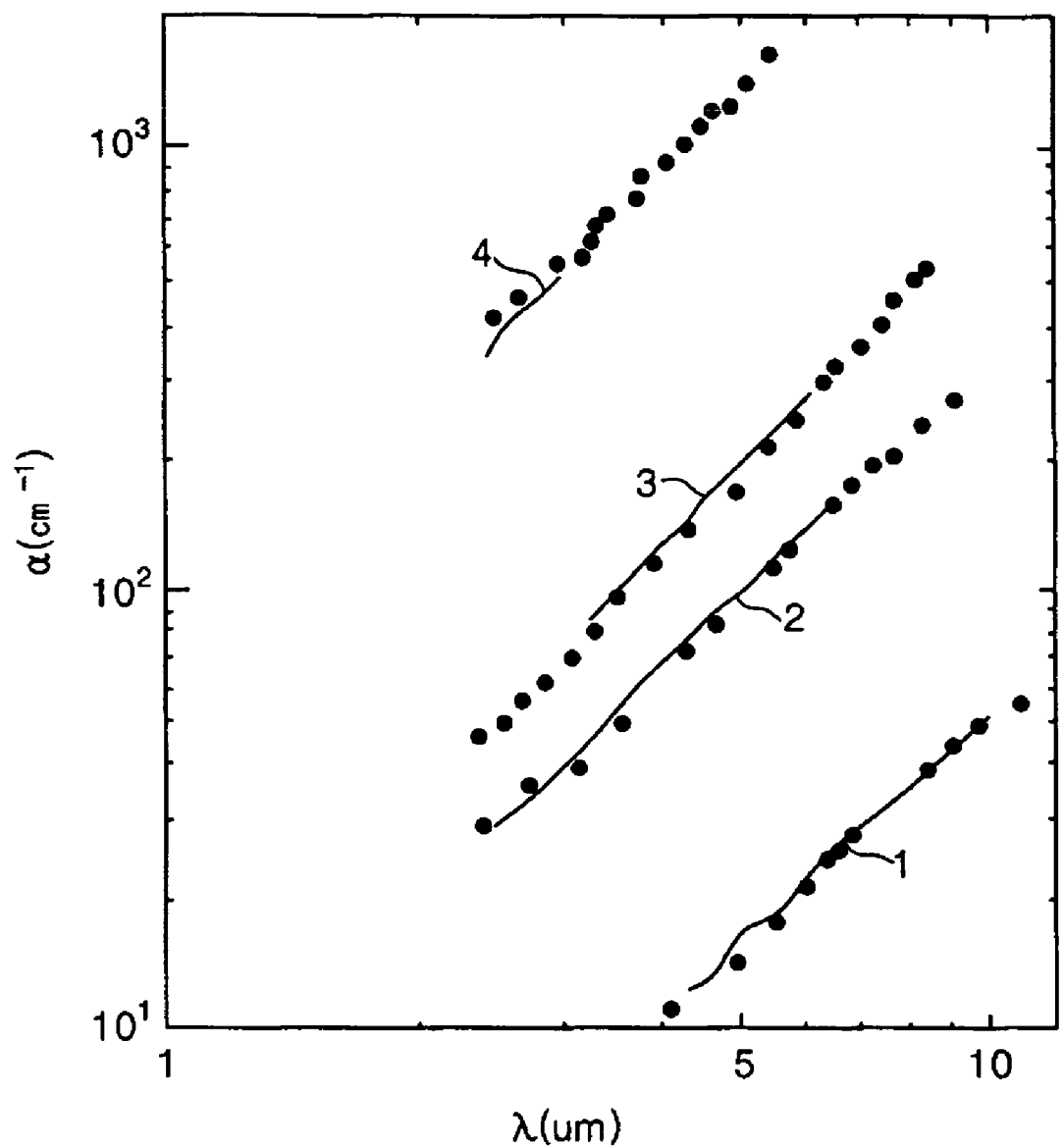
FIG. 2 is a graph of absorption coefficient versus wavelength at varying doping levels of a p-type silicon (Si) wafer.

The present invention will now be described more fully hereinafter with reference to the accompanying drawings, in which preferred and alternate embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present. Like reference numerals and characters refer to like elements throughout.

First Embodiment

In a first embodiment of the present invention, a free carrier pumping method is used to increase a free carrier concentration in a semiconductor substrate.

Figure 3:
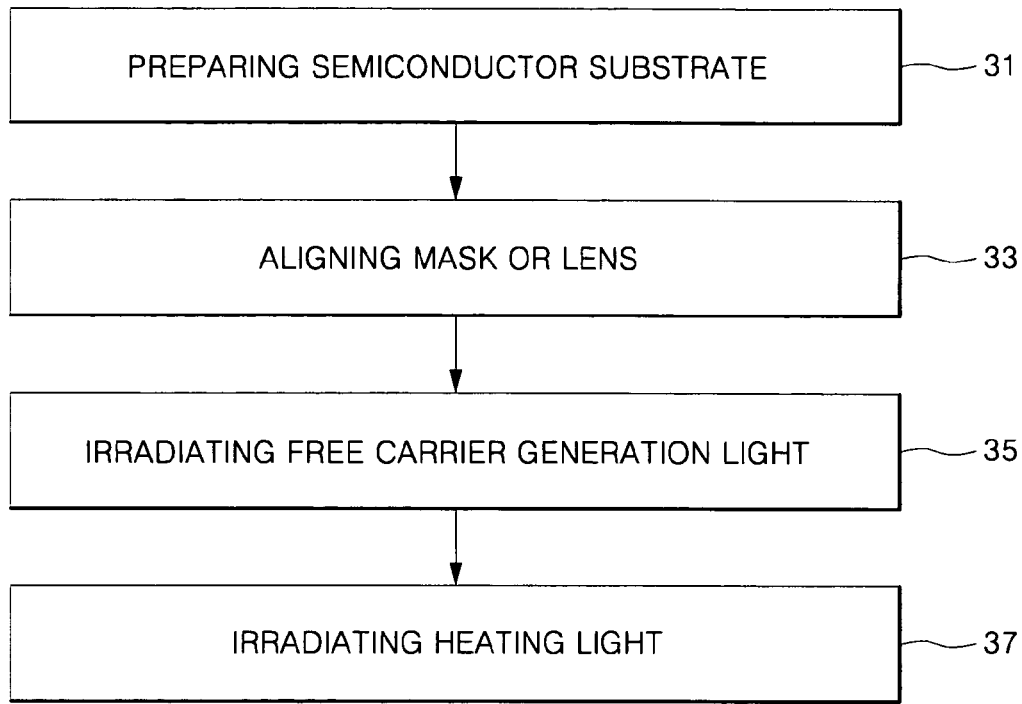
FIG. 3 is a flowchart showing stages in a method of selectively heating a predetermined region of a semiconductor substrate according to a first embodiment of the present invention.
Figure 4:
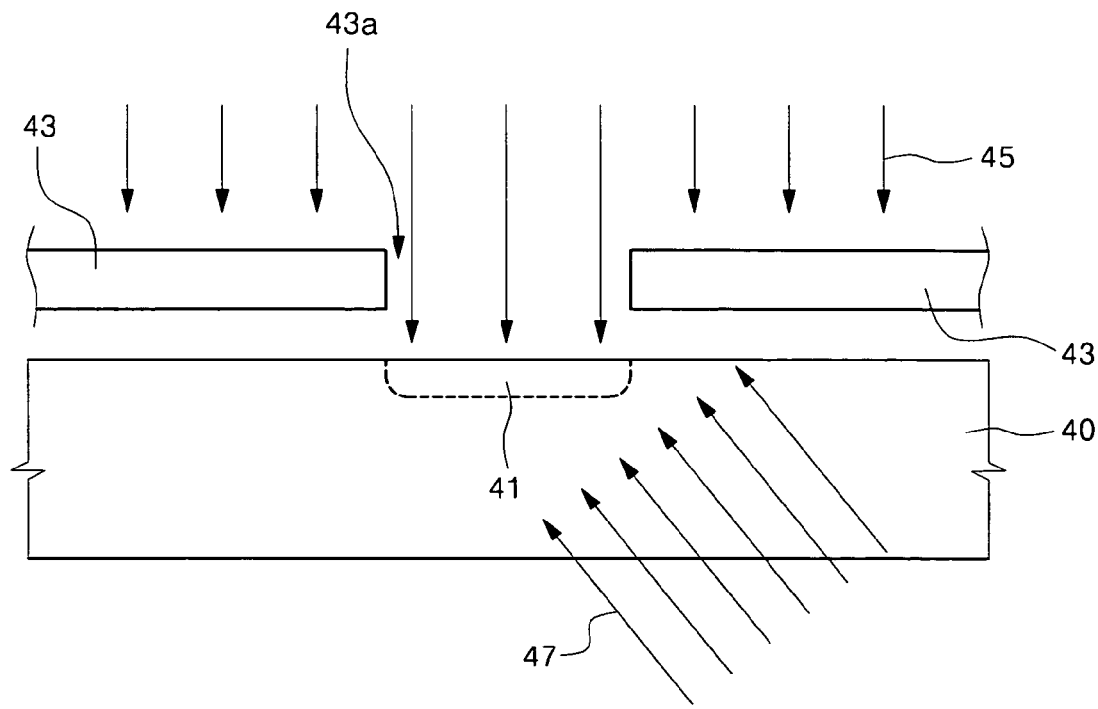
FIG. 4 illustrates a sectional view of an operation of the first embodiment of the present invention.

FIG. 3 is a flowchart showing stages in a method of selectively heating a predetermined region of a semiconductor substrate according to a first embodiment of the present invention. FIG. 4 illustrates a sectional view of an operation of the first embodiment of the present invention.

Referring to FIGS. 3 and 4, in step 31, a semiconductor substrate 40 is prepared. The semiconductor substrate 40 may be a silicon (Si) substrate or may be formed of some other semiconductor material, such as germanium (Ge), gallium arsenide (GaAs), or indium arsenide (InAs). In step 33, a mask 43 or a condensing lens (not shown) is aligned over the semiconductor substrate 40. The mask is aligned to expose a predetermined region 41 of the semiconductor substrate 40 through an opening 43a in the mask 43. Alternately, the condensing lens is aligned above the semiconductor substrate 40 to focus a light to be irradiated onto only a predetermined region 41 of the semiconductor substrate 40. In step 35, a free carrier generation light 45 is irradiated onto the semiconductor substrate 40. Due to the placement of the mask 43 or condensing lens, the free carrier generation light 45 is focused onto only the predetermined region 41 of the semiconductor substrate 40. As described above, when the free carrier generation light 45 is irradiated onto the predetermined region 41 of the semiconductor substrate 40, a free carrier concentration in the predetermined region of the semiconductor substrate is increased. The free carrier generation light 45 is preferably irradiated to be normally incident on a top surface of the semiconductor substrate at a center of the predetermined region 41.

An important consideration in selecting the free carrier generation light is that the free carrier generation light is only required to raise a free carrier concentration to approximately $10^{18}$ cm$^{-3}$. Thus, a laser having a relatively low power, such as 100 mW, is sufficient to act as the free carrier generation light. More specifically, the free carrier generation light should not cause a phase change at the predetermined region of the semiconductor substrate. In particular, the power of the free carrier generation light should be selected so that an increase in a temperature of the predetermined region is relatively small, e.g., approximately 5° C. or less. Preferably, a one-photon energy of the free carrier generation light has an energy greater than a band gap energy of the semiconductor substrate. Preferably, the free carrier generation light is a laser beam having a wavelength of approximately 670 nm, a diameter of approximately 50 μm, and a power of approximately 100 mW. The free carrier generation light may be a W-Halogen lamp.

A more detailed description of the process of increasing free carrier concentration according to the first embodiment of the present invention will now be described with reference to FIGS. 5 and 6.

Figure 5:
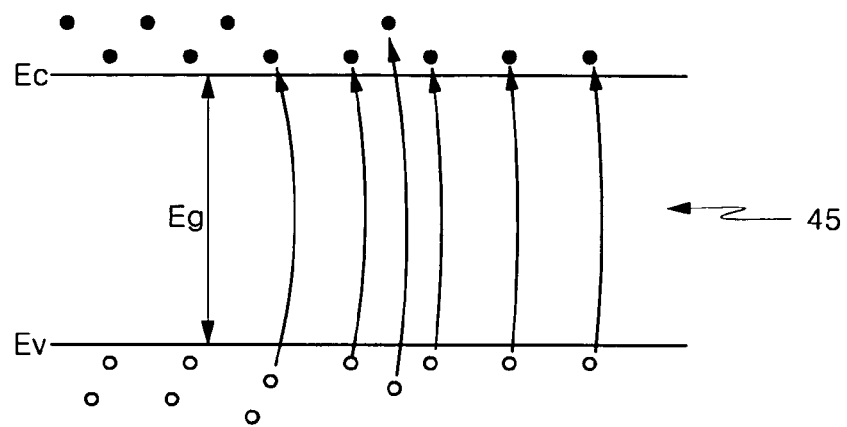
FIG. 5 illustrates a mechanism of free carrier generation.

FIG. 5 illustrates a mechanism of free carrier generation. In FIG. 5, the free carrier generation light 45 has an energy of hv. If the energy of the one photon of the free carrier generation light hv is larger than a band gap energy Eg, i.e., a difference between an energy of a valence band Ev and an energy of a conduction band Ec, then irradiation of that energy yields absorption. When the free carrier generation light is irradiated onto the predetermined region of the semiconductor and absorbed, the electrons in the valence band are "pumped up" to the conduction band. Accordingly, electron-hole pairs are generated in the predetermined region of the semiconductor substrate. The generation of electron-hole pairs results in a sufficient increase in free carrier concentration in the predetermined region of the semiconductor substrate so that the predetermined region can be selectively heated with a heating light. More specifically, if there are sufficient free carriers, i.e., electrons in the conduction band and holes in the valence band, the semiconductor substrate is able to absorb light having a relatively long wavelength. A free carrier concentration of $10^{18}$ cm$^{-3}$ is sufficiently high for the purposes of the present invention.

Figure 6:
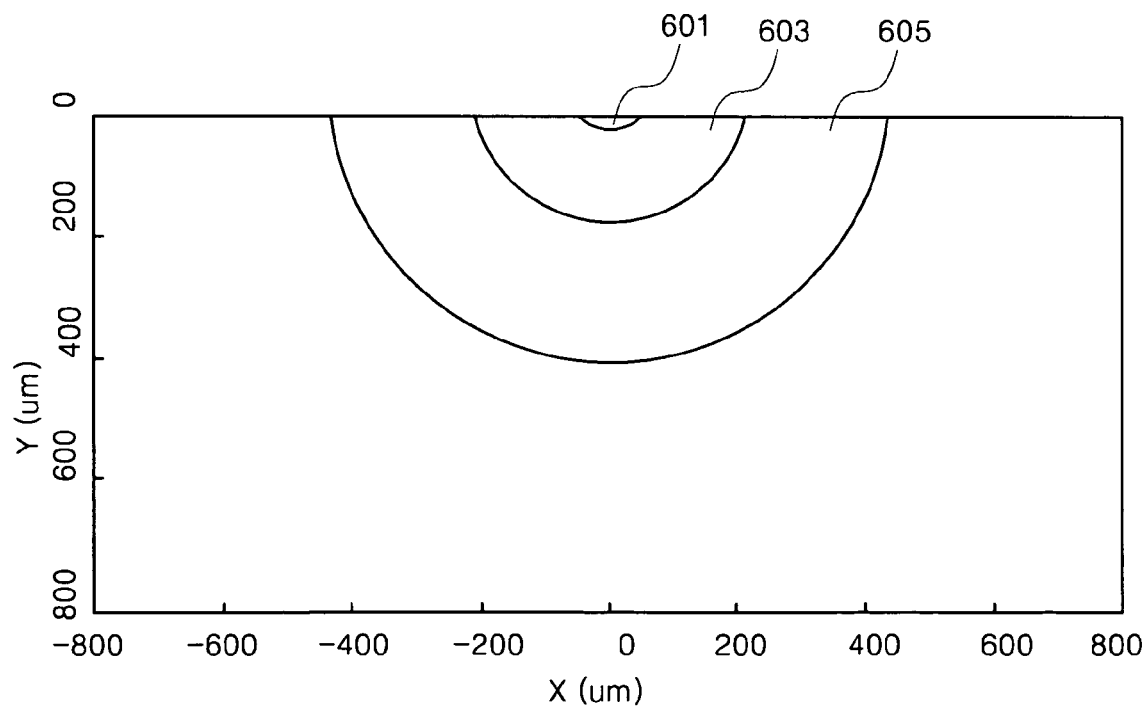
FIG. 6 illustrates a sectional view of an effect of a free carrier generation light on a predetermined region of the semiconductor substrate.

FIG. 6 illustrates a sectional view of an effect of the free carrier generation light on the predetermined region of the semiconductor substrate. Referring to FIG. 6, when a free carrier generation light having a diameter of about 50 μm is irradiated onto a predetermined region of the semiconductor substrate, a free carrier concentration increases in the predetermined region. In a first region 601 nearest to the incidence of the free carrier generation light, a concentration is increased to greater than about $10^{18}$ cm$^{-3}$. In a second region 603, which is adjacent to the first region 601, a concentration is increased to between about $10^{17}$ cm$^{-3}$ and $10^{18}$ cm$^{-3}$. In a third region 605, which is adjacent to the second region 603, a concentration is increased to between about $10^{16}$ cm$^{-3}$ and $10^{17}$ cm$^{-3}$.

Referring back to FIGS. 3 and 4, in step 37, a heating light 47 is irradiated onto the semiconductor substrate 40 to selectively heat the predetermined region 41 of the semiconductor substrate 40 due to the increased absorption coefficient of the predetermined region 41. In view of the increased free carrier concentration and the corresponding increase in absorption coefficient, the heating light 47 may have a wavelength greater than the wavelength corresponding to a band gap energy of the semiconductor substrate and a power sufficiently high to heat selectively only the predetermined region of the semiconductor substrate. Preferably, a wavelength of the heating light is sufficiently long to selectively heat the predetermined region of the semiconductor substrate by a free carrier absorption mechanism. Preferably, the heating light is an infrared laser, such as a $CO_2$ laser. More preferably, the heating light is a $CO_2$ laser having a relatively long wavelength of 10 μm and a relatively high power, e.g., up to approximately 3000 W.

According to this method, the absorption coefficient of the semiconductor substrate 40 is only increased at the predetermined region 41 of the semiconductor substrate 40. Thus, the remainder of the semiconductor substrate 40 does not absorb the heating light 47. Accordingly, the heating light may be irradiated onto either a front surface or a rear surface of the semiconductor substrate 40.

Second Embodiment

In a second embodiment of the present invention, a thermal generation method is used to increase the free carrier concentration in the semiconductor substrate.

Figure 7:
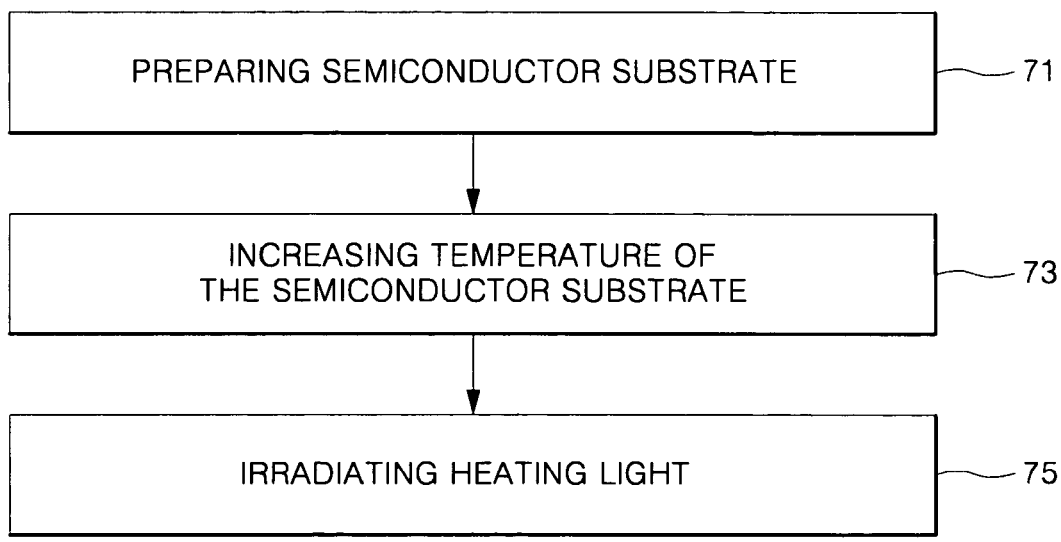
FIG. 7 is a flowchart showing steps in a method of heating a semiconductor substrate according to a second embodiment of the present invention.

FIG. 7 is a flowchart showing steps in a method of heating a semiconductor substrate according to a second embodiment of the present invention.

Referring to FIG. 7, in step 71, a semiconductor substrate is prepared. The semiconductor substrate may be a silicon (Si) substrate or may be formed of some other semiconductor material, such as germanium (Ge), gallium arsenide (GaAs), or indium arsenide (InAs). In step 73, the temperature of the semiconductor substrate is increased to thermally generate free carriers.

Figure 8:
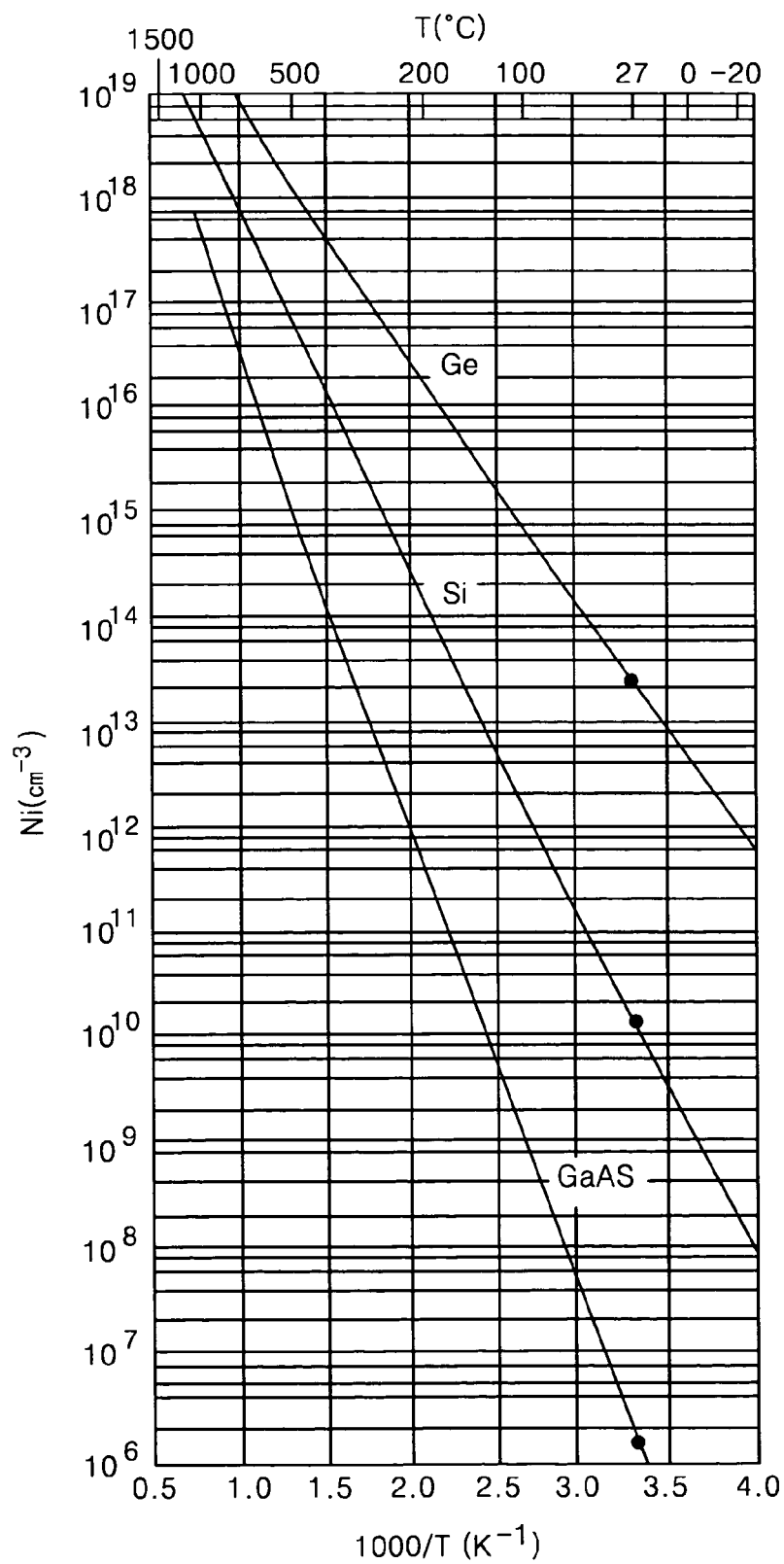
FIG. 8 is a graph of temperature versus intrinsic carrier density.

An important consideration in increasing the temperature of the semiconductor substrate is that any change in temperature changes multiple other characteristics of the semiconductor substrate, e.g., lattice constant and band gap energy. Accordingly, it is preferable to minimize an amount of heating of the semiconductor substrate. FIG. 8 is a graph of temperature versus intrinsic carrier density. As described in connection with the first embodiment, the free carrier concentration should be increased to about $10^{18}$ $cm^{-3}$ to provide for sufficient absorption of a heating light, which will be described subsequently. Based on FIG. 8, it may be seen that heating a semiconductor substrate formed of silicon (Si) to a temperature of 800° C. increases the intrinsic carrier density to $10^{18}$ $cm^{-3}$. Alternatively, if the semiconductor substrate is formed of germanium (Ge), then the substrate only requires heating up to 500° C. to achieve an intrinsic carrier density of $10^{18}$ $cm^{-3}$. In view of the disadvantages associated with heating silicon (Si) to a temperature of 800° C., it is preferable to use germanium (Ge) in this second embodiment of the present invention and to heat the germanium substrate to a temperature of about 500° C.

Referring back to FIG. 7, in step 75, a heating light is irradiated onto the semiconductor substrate to heat the semiconductor substrate due to the increased absorption coefficient of the substrate. In view of the increased free carrier concentration and the corresponding increase in absorption coefficient, the heating light may have a wavelength greater than the wavelength corresponding to a band gap energy of the semiconductor substrate and a power sufficiently high to heat selectively only the predetermined region of the semiconductor substrate. Preferably, the heating light is an infrared laser, such as a $CO_2$ laser. More preferably, the heating light is a $CO_2$ laser having a relatively long wavelength of 10 μm and a relatively high power, e.g., up to approximately 3000 W.

The method according to the second embodiment of the present invention is particularly useful in connection with semiconductor substrates formed of a material having a relatively small band gap energy, such as germanium (Ge) and indium arsenide (InAs).

Third Embodiment

In a third embodiment of the present invention, a doping process is used to increase a free carrier concentration in a semiconductor substrate.

Figure 9:
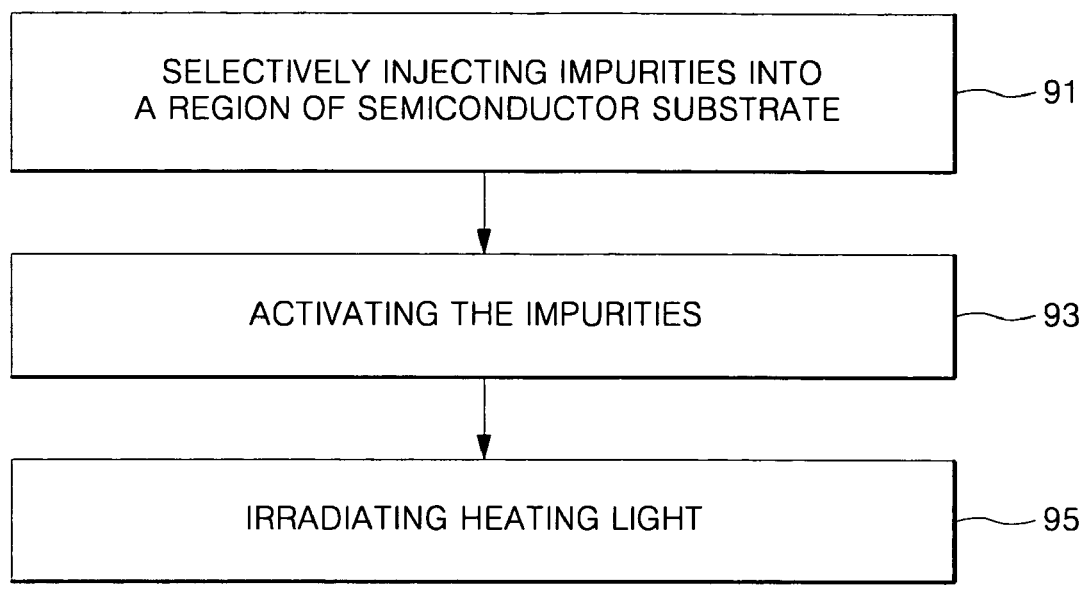
FIG. 9 is a flowchart showing steps in a method of selectively heating a predetermined region of a semiconductor substrate according to a third embodiment of the present invention.
Figure 10A:
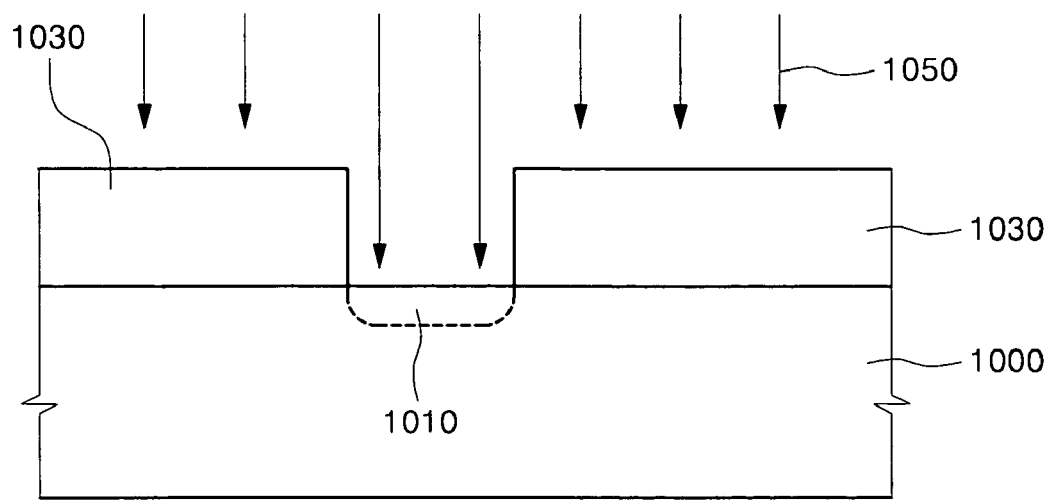
FIGS. 10A and 10B illustrate sectional views of stages in an operation of the third embodiment of the present invention.
Figure 10B:
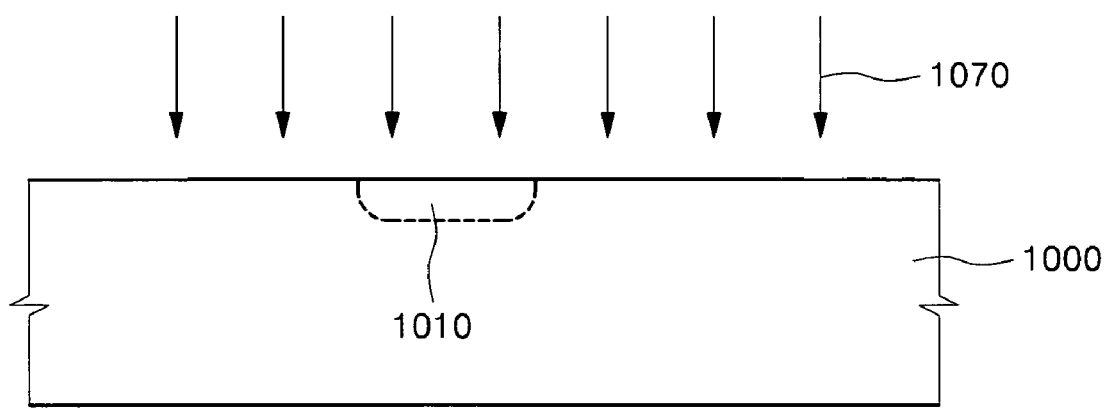

FIG. 9 is a flowchart showing steps in a method of selectively heating a predetermined region of a semiconductor substrate according to a third embodiment of the present invention. FIGS. 10A and 10B illustrate sectional views of stages in an operation of the third embodiment of the present invention.

Referring to FIGS. 9 and 10A, in step 91, a semiconductor substrate 1000 is provided and then impurities 1050 are selectively injected into a predetermined region 1010 of the semiconductor substrate 1000. The semiconductor substrate may be a silicon (Si) substrate or may be formed of some other semiconductor material, such as germanium (Ge), gallium arsenide (GaAs), or indium arsenide (InAs).

To selectively inject the impurities into the predetermined region 1010 of the semiconductor substrate 1000, a mask 1030 is formed over the semiconductor substrate 1000. The mask 1030 has an opening to expose the predetermined region 1010 of the semiconductor substrate 1000. A doping process 1050 is then performed to increase the free carrier concentration of the predetermined region 1010 of the semiconductor substrate 1000. While the doping process is preferably an ion implantation process, the doping process may also be a diffusion process or an in-situ doping process.

According to this third embodiment of the present invention, a separate step of annealing the semiconductor substrate to activate the impurities is not required because the implantation process alone sufficiently increases the free carrier concentration and correspondingly, the absorption coefficient, to provide absorption of a heating light. However, an annealing process to activate the impurities may be optionally performed, step 93 of FIG. 9. If performed, activating the dopant by heating the semiconductor substrate would further increase the absorption coefficient of the predetermined region. Activating the dopant may be performed by heating the semiconductor substrate 1000 to a temperature of approximately 500° C. to 700° C. Preferably, activating the dopant is performed for a short time to avoid dopant diffusion.

Subsequently, referring to FIG. 10B, the mask 1030 is removed, if necessary, and, in step 95, a heating light 1070 is irradiated onto the semiconductor substrate 1000 to heat the predetermined region 1010 of the semiconductor substrate 1000 due to the increased free carrier concentration and increased absorption coefficient of the predetermined region 1010. In view of the increased free carrier concentration and the corresponding increase in absorption coefficient, the heating light may have a wavelength greater than the wavelength corresponding to a band gap energy of the semiconductor substrate and a power sufficiently high to heat selectively only the predetermined region of the semiconductor substrate. Preferably, the heating light is an infrared laser, such as a $CO_2$ laser. More preferably, the heating light is a $CO_2$ laser having a relatively long wavelength of 10 μm and a relatively high power, e.g., up to approximately 3000 W.

According to this third embodiment of the present invention, if the heating light is irradiated onto the semiconductor substrate in an oxygen environment, for example, an oxide will grow only on the predetermined region 1010 of the semiconductor substrate 1000.

Exemplary Applications

To further illustrate the present invention, several exemplary applications of the first embodiment of the present invention will now be described.

Figure 11:
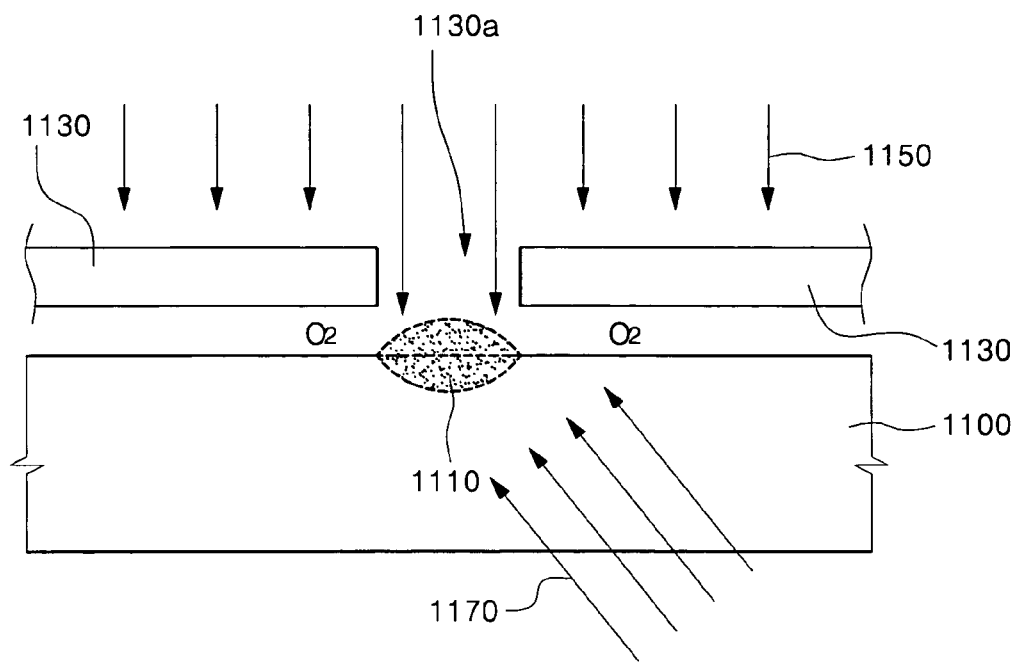
FIG. 11 illustrates a first exemplary application of the first embodiment of the present invention.

A first exemplary application is a planar isolation demonstrating a local heating of a semiconductor substrate using a $CO_2$ laser. Referring to FIG. 11, a selected region 1110 of a substrate 1100, which may be a silicon (Si) substrate, is exposed by an opening 1130a in a mask 1130. Alternately, a condensing lens (not shown) may be used instead of the mask 1130. Initially, a free carrier generation light 1150 is irradiated onto the substrate. Due to the placement of the mask 1130, the free carrier generation light 1150 only reaches the selected region 1110 of the substrate 1100 through the opening area 1130a, i.e., the free carrier generation light 1150 is not irradiated onto the remainder of the substrate 1100. Accordingly, the free carrier concentration is increased within the selected region but is not increased in the remainder of the substrate 1100. As described above, this increase in free carrier concentration increases the absorption coefficient of the selected region 1110 of the substrate

1100. Subsequently, a heating light 1170 is irradiated onto the substrate 1100. Heat of the heating light 1170 is only absorbed at the selected region 1110 of the substrate 1100 having the increased absorption coefficient. Accordingly, only the selected region 1110 of the substrate 1100 is heated. As shown in FIG. 11, in an oxygen environment, a reaction only occurs at the selected region 1110 of the substrate 1100.

In view of the relatively high absorption coefficient in the predetermined region 1110 of the semiconductor substrate 1100 and the relatively low absorption coefficient in the remainder of the substrate 1100, the heating light 1170 may be irradiated onto either a front surface or a rear surface of the semiconductor substrate.

A second exemplary application is a formation of a multi-gate oxide layer. This application provides for direct growth of a gate oxide on a predetermined region. More specifically, forming a gate oxide according to the second exemplary application eliminates a need for additional steps of conventional lithography and etching.

Figure 12:
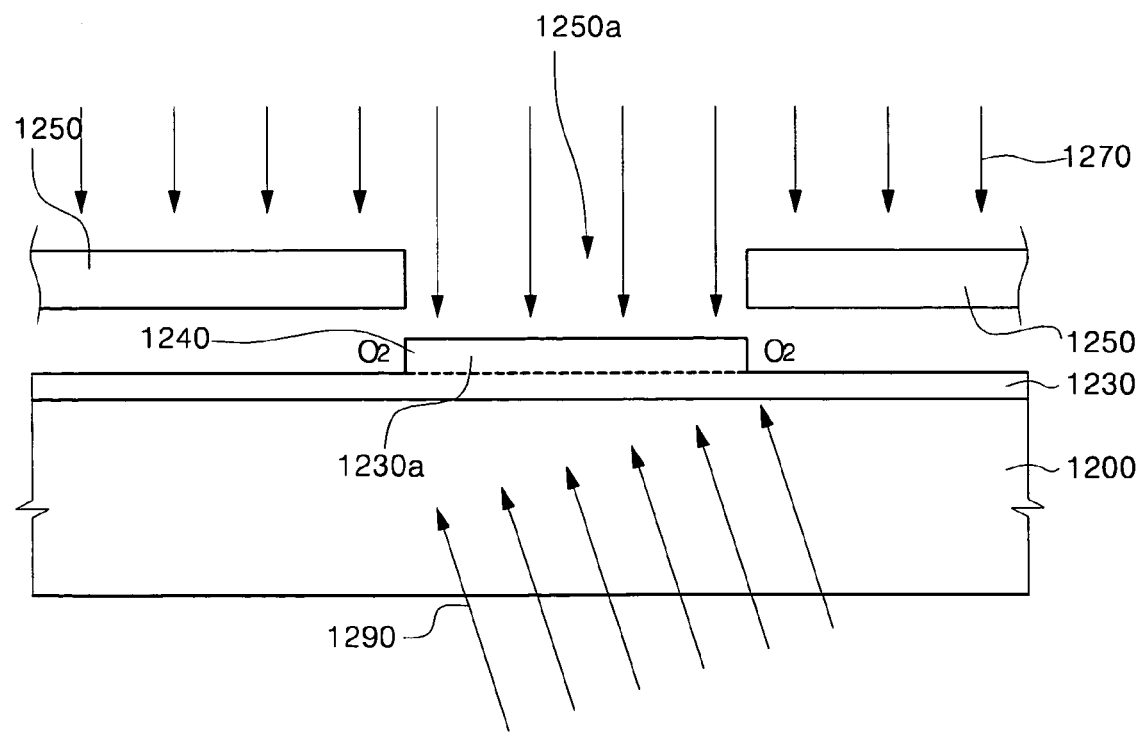
FIG. 12 illustrates a second exemplary application of the first embodiment of the present invention.

Referring to FIG. 12, a first gate oxide layer 1230 is formed on a surface of a substrate 1200, which may be a silicon (Si) substrate. A selected portion of the first gate oxide 1230 formed over a predetermined region 1230*a* of the semiconductor substrate 1200 is exposed by an opening 1250*a* in a mask 1250. Alternately, a condensing lens (not shown) may be used instead of the mask 1250. Initially, a free carrier generation light 1270 is irradiated onto the first gate oxide 1230 and the mask 1250. Due to the position of the mask 1250, the free carrier generation light 1270 only reaches the exposed selected region 1230*a* of the first gate oxide 1230 and the substrate 1200 through the opening area 1250*a*. The free carrier generation light 1270 is not irradiated onto the remainder of the first gate oxide 1230 and semiconductor substrate 1200. Accordingly, the free carrier concentration is increased within the selected region but is not increased in the remainder of the substrate. Subsequently, a heating light 1290 is irradiated onto the substrate 1200 in an oxygen ($O_2$) environment. Heat of the heating light 1290 is only absorbed at the selected region 1230*a* of the substrate 1200 having an increased absorption coefficient due to the increased free carrier concentration. Accordingly, only the selected region 1230*a* of the substrate 1200 is heated by the heating light 1290. As shown in FIG. 12, a second oxide layer 1240 is formed on the first gate oxide layer 1230 in only the selected region 1230*a*. Formation of the second oxide layer 1240 at only the selected region 1230*a* of the substrate 1200 results in a thicker oxide region suitable for use in a high voltage-gate-oxide transistor.

Figure 13:
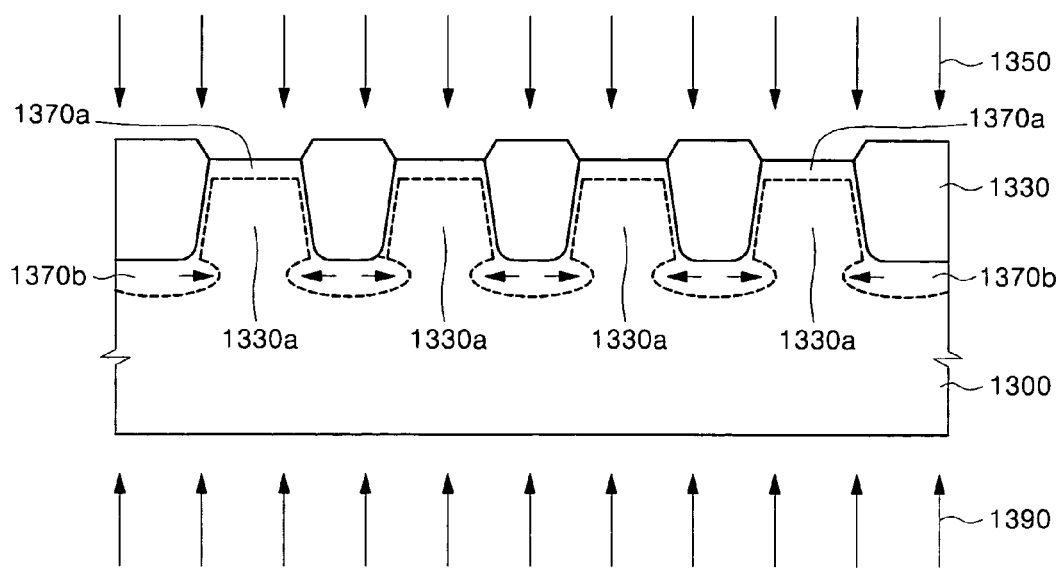
FIG. 13 illustrates a third exemplary application of the first embodiment of the present invention.

A third exemplary application is a method of performing a selective heating in a trench isolation structure. Referring to FIG. 13, there is a semiconductor substrate 1300 having a plurality of trench isolation regions 1330. Located between each adjacent trench isolation region 1330 is an active area 1330*a*. A first high concentration free carrier region 1370*a* is formed above each active area 1330*a*. A second high concentration free carrier region 1370*b* is located below each trench isolation 1330.

Application of a method according to the present invention allows selective heating of particular regions on a micrometer scale. More specifically, a free carrier generation light 1350 is used to form the first high concentration free carrier regions 1370*a*. It is the first high concentration free carrier regions 1370*a* that will be selectively heated. Subsequently, application of a heating light 1390 selectively heats the first high concentration free carrier regions 1370*a*.

The selective heating occurs because the trench isolation regions 1330 obstruct a lateral diffusion of free carriers in the first high concentration free carrier regions 1370*a*. The free carriers in the second high concentration free carrier regions 1370*b*, however, are able to diffuse out of those regions, thereby lowering free carrier concentrations to about $10^{16}$ cm$^{-3}$ to $10^{17}$ cm$^{-3}$. A decrease in free carrier concentration in the second high concentration free carrier regions 1370*b* prevents heating of the second high concentration free carrier regions 1370*b* by the heating light 1390.

The first and second high concentration free carrier regions 1370*a* and 1370*b* are then irradiated by the heating light 1390. As described above, only the first high concentration free carrier regions 1370*a* are selectively heated by the heating light 1390 because only the first high concentration free carrier regions 1370*a* have a sufficiently high free carrier concentration to increase the absorption coefficient for heating. Therefore, during irradiation of the heating light 1390, the first high concentration free carrier regions 1370*a* have a sufficiently high concentration of free carriers to allow heating and the second high concentration free carrier regions 1370*b* do not have a sufficiently high free carrier concentration to allow heating.

Figure 14A:
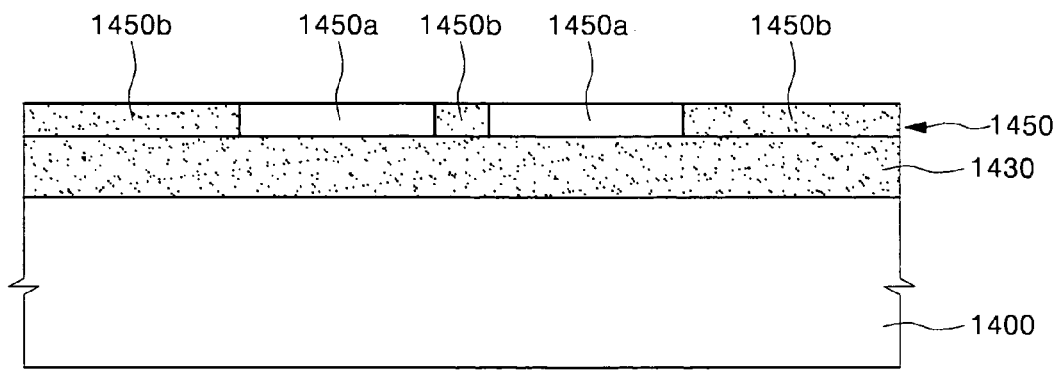
FIGS. 14A and 14B illustrate a fourth exemplary application of the first embodiment of the present invention.
Figure 14B:
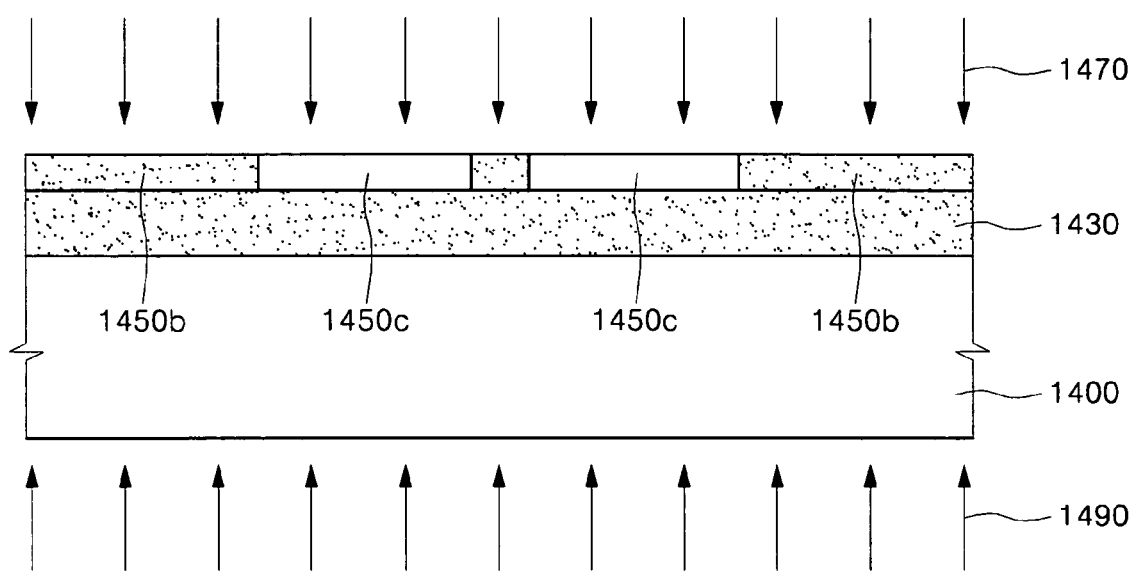

FIGS. 14A and 14B illustrate sectional views of a fourth exemplary application of the present invention. The fourth exemplary application is a selective annealing of an amorphous or polycrystalline silicon layer. Referring to FIG. 14A, a dielectric layer 1430 is formed over a surface of a substrate 1400, which may be either a silicon wafer or a glass surface such as a thin film transistor (TFT)-LCD substrate. An active layer 1450 for an electrical device is then formed over the dielectric layer 1430. The active layer 1450 includes regions of amorphous or polycrystalline silicon 1450*a* and a device isolation layer 1450*b*.

Referring to FIG. 14B, a free carrier generation light 1470 and a heating light 1490 are then sequentially irradiated onto the active layer 1450. The irradiation of the free carrier generation light 1470 and the heating light 1490 selectively converts the regions of amorphous or polycrystalline silicon into crystallized active areas 1450*c*.

Preferred and alternate embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method of selectively heating a predetermined region of a semiconductor substrate, comprising:
   a. providing a semiconductor substrate;
   b. selectively focusing a free carrier generation light on only a predetermined region of the semiconductor substrate;
   c. irradiating the free carrier generation light on the predetermined region of the semiconductor substrate to increase a free carrier concentration within the predetermined region of the semiconductor substrate, wherein the free carrier generation light causes the predetermined region to increase in temperature by less than a temperature necessary to change a the solid phase of the predetermined region; and
   d. irradiating the semiconductor substrate with a heating light to selectively heat the predetermined region of the semiconductor substrate.

2. The method of selectively heating a predetermined region of a semiconductor substrate as claimed in claim 1, wherein a one-photon energy of the free carrier generation light has an energy greater than a band gap energy of the semiconductor substrate.

3. The method of selectively heating a predetermined region of a semiconductor substrate as claimed in claim 1, wherein the free carrier generation light causes the predetermined region to increase in temperature by approximately 5° C. or less.

4. The method of selectively heating a predetermined region of a semiconductor substrate as claimed in claim 1, wherein the free carrier generation light is a laser beam having a wavelength of approximately 670 nm.

5. The method of selectively heating a predetermined region of a semiconductor substrate as claimed in claim 1, wherein the free carrier generation light is a laser beam having a diameter of approximately 50 μm.

6. The method of selectively heating a predetermined region of a semiconductor substrate as claimed in claim 1, wherein the free carrier generation light is a laser beam having a power of approximately 100 mW.

7. The method of selectively heating a predetermined region of a semiconductor substrate as claimed in claim 1, wherein the free carrier generation light is a W-Halogen lamp.

8. The method of selectively heating a predetermined region of a semiconductor substrate as claimed in claim 1, wherein selectively focusing the free carrier generation light comprises:
aligning a mask above the semiconductor substrate.

9. The method of selectively heating a predetermined region of a semiconductor substrate as claimed in claim 1, wherein selectively focusing the free carrier generation light comprises:
aligning a condensing lens above the semiconductor substrate.

10. The method of selectively heating a predetermined region of a semiconductor substrate as claimed in claim 1, wherein the semiconductor substrate is formed of a material selected from the group consisting of Si, Ge, GaAs, and InAs.

11. The method of selectively heating a predetermined region of a semiconductor substrate as claimed in claim 1, wherein the heating light has a wavelength greater than a wavelength corresponding to a band gap energy of the semiconductor substrate.

12. The method of selectively heating a predetermined region of a semiconductor substrate as claimed in claim 1, wherein the heating light has a power sufficiently high to heat selectively only the predetermined region of the semiconductor substrate.

13. The method of selectively heating a predetermined region of a semiconductor substrate as claimed in claim 1, wherein a wavelength of the heating light is sufficiently large to selectively heat the predetermined region of the semiconductor substrate by a free carrier absorption mechanism.

14. The method of selectively heating a predetermined region of a semiconductor substrate as claimed in claim 1, wherein the heating light is an infrared laser.

15. The method of selectively heating a predetermined region of a semiconductor substrate as claimed in claim 1, wherein the heating light is a $CO_2$ laser.

16. The method of selectively heating a predetermined region of a semiconductor substrate as claimed in claim 1, wherein the heating light has a power of up to approximately 3000 W.

17. The method of selectively heating a predetermined region of a semiconductor substrate as claimed in claim 1, wherein the heating light is irradiated onto either a front surface or a rear surface of the semiconductor substrate.

18. The method of selectively heating a predetermined region of a semiconductor substrate as claimed in claim 1, wherein irradiating the semiconductor substrate with a heating light to selectively heat the predetermined region of the semiconductor substrate is performed in an oxygen environment, and wherein a reaction occurs only at the predetermined region of the semiconductor substrate.

19. The method of selectively heating a predetermined region of a semiconductor substrate as claimed in claim 1, further comprising:
forming a first oxide layer on the semiconductor substrate before irradiating the free carrier generation light,
wherein irradiating the semiconductor substrate with a heating light to selectively heat the predetermined region of the semiconductor substrate causes a second oxide layer to be formed on the first oxide layer only in the predetermined region.

20. The method of selectively heating a predetermined region of a semiconductor substrate as claimed in claim 1, wherein the predetermined region of the semiconductor substrate is a first high concentration free carrier region in a trench isolation structure, the first high concentration free carrier region being located above an active area between adjacent trench isolation regions in the semiconductor substrate.

21. The method of selectively heating a predetermined region of a semiconductor substrate as claimed in claim 1, further comprising:
forming a dielectric layer and an active layer sequentially on the semiconductor substrate before irradiating the free carrier generation light, the active layer including regions of amorphous or polycrystalline silicon and device isolation regions,
wherein irradiating the semiconductor substrate with a heating light to selectively heat the predetermined region of the semiconductor substrate selectively converts the regions of amorphous or polycrystalline silicon into crystallized active areas.

22. The method of selectively heating a predetermined region of a semiconductor substrate as claimed in claim 21, wherein the semiconductor substrate is a silicon (Si) wafer or a glass surface.

23. A method of heating a semiconductor substrate, comprising:
a. providing a semiconductor substrate;
b. heating the semiconductor substrate to thermally generate free carriers, thereby increasing a free carrier concentration of the semiconductor substrate and increasing an absorption coefficient of the semiconductor substrate; and
c. irradiating the semiconductor substrate with a heating light to heat the semiconductor substrate, wherein a wavelength of the heating light is longer than a wavelength of a bandgap energy of the semiconductor substrate.

24. The method of heating a semiconductor substrate as claimed in claim 23, wherein the semiconductor substrate is formed of silicon (Si) and is heated to a temperature of about 800° C.

25. The method of heating a semiconductor substrate as claimed in claim 23, wherein the semiconductor substrate is formed of germanium (Ge) and is heated to a temperature of about 500° C.

26. The method of heating a semiconductor substrate as claimed in claim 23, wherein the heating light is an infrared laser.

27. The method of heating a semiconductor substrate as claimed in claim 23, wherein the heating light is a $CO_2$ laser.

28. The method of heating a semiconductor substrate as claimed in claim 23, wherein the heating light has a power of up to approximately 3000 W.

* * * * *